United States Patent [19]
Cherng

[11] Patent Number: 6,010,933
[45] Date of Patent: Jan. 4, 2000

[54] METHOD FOR MAKING A PLANARIZED CAPACITOR-OVER-BIT-LINE STRUCTURE FOR DYNAMIC RANDOM ACCESS MEMORY (DRAM) DEVICES

[75] Inventor: George Meng-Jaw Cherng, Hsinchu, Taiwan

[73] Assignee: Vanguard International Semiconductor, Hsin-Chu, Taiwan

[21] Appl. No.: 09/118,036

[22] Filed: Jul. 17, 1998

[51] Int. Cl.[7] .............................................. H01L 21/8242
[52] U.S. Cl. ........................ 438/253; 438/396; 438/397
[58] Field of Search ................................... 438/253, 254, 438/255, 256, 396, 397, 398, 399

[56] References Cited

U.S. PATENT DOCUMENTS

| | | |
|---|---|---|
| 5,389,568 | 2/1995 | Yun . |
| 5,405,800 | 4/1995 | Ogawa et al. ........................... 438/258 |
| 5,543,345 | 8/1996 | Liaw et al. . |
| 5,554,557 | 9/1996 | Koh . |
| 5,923,972 | 7/1999 | Lee ......................................... 438/253 |
| 5,926,709 | 7/1999 | Aisou et al. ............................ 438/253 |
| 5,956,594 | 9/1999 | Yang et al. ............................. 438/396 |

*Primary Examiner*—Tuan H. Nguyen
*Attorney, Agent, or Firm*—George O. Saile; Stephen B. Ackerman

[57] ABSTRACT

A method for making a planarized capacitor-over-bit lines structure on dynamic random access memory devices was achieved. After forming the array of FETs for the memory cells, a first polysilicon layer is deposited and patterned to simultaneously form bit lines and polysilicon landing pads that also form the node contacts for stacked capacitors. A thick first insulating layer is deposited and planarized. Node contact openings are etched in the first insulating layer to the landing pads and a thin second polysilicon layer is deposited which also fills the contact openings. Trenches are etched through the second polysilicon layer and into the first insulating layer around the desired capacitor areas while protecting the remaining DRAM chip area from etching. A thin third polysilicon layer is deposited and etched back to form sidewall spacers and to form capacitor bottom electrodes with increased capacitance. A thin interelectrode dielectric layer is deposited followed by a relatively thin fourth polysilicon layer. A photoresist mask is used to pattern the thin fourth polysilicon to form the capacitor plate electrode and to concurrently etch the thin second polysilicon to the planar first insulating layer providing an array of memory cells that are essentially planar with the peripheral areas of the DRAM chip areas.

21 Claims, 4 Drawing Sheets

METHOD FOR MAKING A PLANARIZED CAPACITOR-OVER-BIT-LINE STRUCTURE FOR DYNAMIC RANDOM ACCESS MEMORY (DRAM) DEVICES

BACKGROUND OF THE INVENTION (1) Field of the Invention

This invention relates to an integrated circuit semiconductor device, and more particularly to a method for fabricating an array of memory cells for dynamic random access memory (DRAM) devices with increased capacitance using a simple process. This new process provides an essentially planar surface over the total surface of the DRAM chip (device). This eliminates a chemical/mechanical polishing (CMP) step that would otherwise be required to provide a planar topography across the DRAM chip.

(2) Description of the Prior Art

The integrated circuit density on chips formed from semiconductor substrates has dramatically increased in recent years. The increase in density is the result of down scaling of the individual semiconductor devices built in and on the substrate. Typically the semiconductor devices are formed from patterned polysilicon layers and doped regions in the substrate, and the interconnect for these individual devices are formed from multilayers of patterning conducting layers, such as doped polysilicon and metal layers with interposed insulating layers. Typically the layers are patterned using high resolution photolithographic techniques and directional etching, such as High Density Plasma (HDP) etching. Unfortunately, as the device feature size decrease to submicrometer dimensions it is necessary to provide a planar surface across the chip for the shallow Depth Of Focus (DOF) needed to expose and develop the high fidelity distortion free images in the overlying photoresist layers. Also the planar surface is necessary to reliably pattern the various material layers used in the fabrication of integrate circuits on the semiconductor substrate when directional plasma etching is use to make submicrometer patterns. For example, when patterning a metal layer to make electrical interconnections over a surface with a rough topography can result in residual metal remaining on the sidewall in recess on the rough surface which can then lead to intralevel shorts between metal lines.

One circuit type experiencing this demand for increased circuit density and the need for an essentially planar surface is the dynamic random access memory (DRAM) chip (or devices) made on a semiconductor substrate and later removed by dicing. The DRAM chip areas on the substrate consist of an array of closely spaced memory cells with address and read/write circuits along the periphery of the chip. Currently in production there are 64 million memory cells on a DRAM chip with minimum features sizes less than a half micrometer. The individual memory cells are formed from a single access transistor, typically a field effect transistor (FET), and a storage capacitor with a node contact to one of the two source/drain areas of the FET. The capacitor is used for storing information in binary form (0's and 1's) as electrical charge, and the second source/drain area is connected to a bit line that is used to read and write information via peripheral circuits on the DRAM chip. World lines that also form the FET gate electrodes are used to randomly access (address) the individual memory cells.

Both trench capacitors, formed in the substrate and stacked capacitors, formed on the substrate surface over the FET are currently being pursued for DRAM applications. However, the stacked capacitor has received considerable attention in recent years because of the various ways its shape can be changed in the vertical direction to increase capacitance without increasing the area it occupies on the cell area. However, as the cell density increases and the cell size shrink to accommodate more cells, it is necessary to increase the vertical dimension of the stacked capacitor. This is to provide sufficient capacitance to maintain the necessary charge for acceptable sign-to-noise levels and to provide a reasonable refresh cycle times.

Unfortunately, as the stacked capacitors are increased in height the topography across the chip becomes rougher, and the problem associated with reliably exposing the photoresist and etching high aspect ratio patterns in the material layers are made more difficult. Although the spaces between the closely spaced capacitors in the memory cell area can be easily filled with an insulator to provide a relatively planar surface, the topography at the perimeter of the array cell near the periphery of the chip can be considerably greater than 1.0 micrometer in height.

Figure 1:
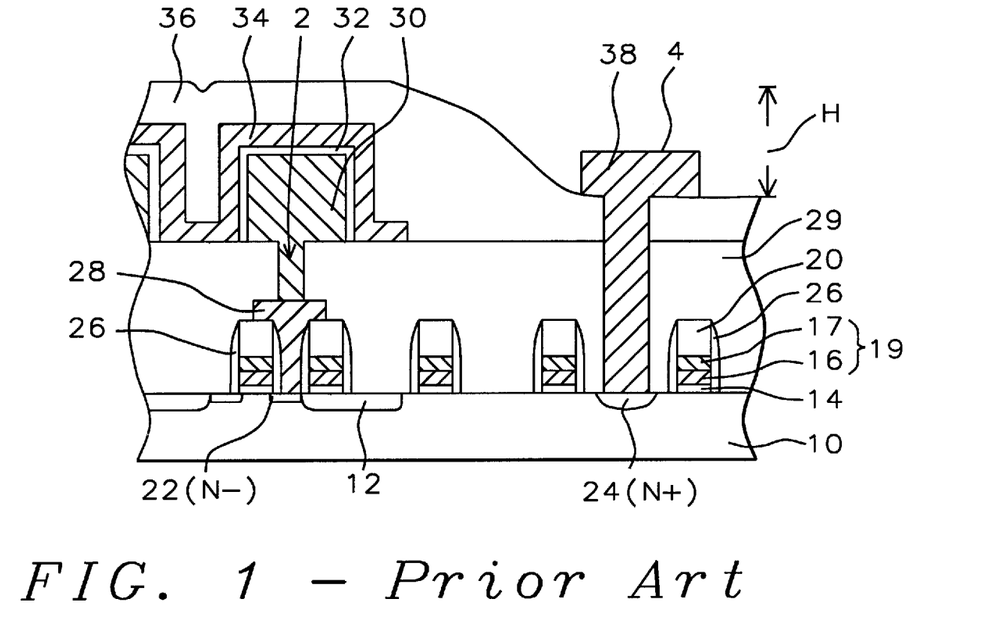
FIG. 1 is a schematic cross-sectional view through a portion a prior art DRAM chip at the perimeter of the array of memory cell depicting the undesirable large step on the DRAM chip surface after forming the stacked capacitor.

To better appreciate this topography problem a schematic cross sectional view of a convention Capacitor-Over-Bit line (COB) DRAM structure at the perimeter of the memory cell array is shown in FIG. 1. The structure consist of a semiconductor substrate 10, in and on which are formed field oxide (FOX) regions 12 to isolated the various device areas on the substrate 10. A gate oxide 14 is grown on the device areas for the FET's and a polycide layer 19 (polysilicon 16 and silicide 17) is deposited with a cap oxide 20, and the multilayer is patterned to form the FET gate electrode. Lightly doped source/drain regions 22($N^-$) are formed by ion implantation or diffusion followed by depositing an insulating layer and anisotropically etching back to form sidewall spacers 26. The FET heavily doped source/drain contact regions 24($N^+$) are then formed by ion implantation in the peripheral area of the DRAM chip, while the memory cell area is masked from implantation to minimize leakage currents. Now in the COB DRAM device (chip), a second polysilicon or polycide layer is deposited and patterned to form the bit lines (not shown in the cross section) and to concurrently form the capacitor node contacts/landing pads 28. An insulating layer 29 is deposited and planarized and node contact openings 2 are etched to the landing pads 28. A thick polysilicon layer 30 is deposited and patterned to form the capacitor bottom electrodes 30 with increased area to provide increased capacitance. However, the patterning of the thick polysilicon requires a thick photoresist mask that further reduces resolution and limits cell density. Other types of stacked capacitor structures can be formed such as cylindrical, fin, crown shaped and the like, but also result in exceptionally rough topography. After forming the bottom electrode 30 a thin interelectrode dielectric layer 32 is formed and another polysilicon layer 34 is deposited and patterned to form the top electrode 34. An insulating layer 36 is then deposited to insulate the capacitors. Unfortunately, the capacitor bottom electrode formed from the thick polysilicon result in a large step having a height H which can be greater than 1.0 um and exacerbate the photoresist image fidelity need to patterned the next layer for integration, such as the via hole 4 and the next level of metal interconnections 38. One conventional method of avoiding this rough topography problem is to deposit a much thicker insulating layer 36 than is shown in FIG. 1 and then chemical/mechanical polishing (CMP) back to globally planarize the surface. However, this additional CMP is costly and can result in substrate damage.

Numerous approaches to making DRAM circuits using COB structures have been reported, but do not address the above rough topography problem, that is the high step at the perimeter of the array of memory cells on the chip. For example, Liaw et al. in U.S. Pat. No. 5,543,345, teaches a method for making crown capacitors, and Koh in U.S. Pat. No. 5,554,557 teaches a method for making stacked capacitors with self-aligned node contacts having an up-ward extending sidewall. Still another method is described by Yun in U.S. Pat. No. 5,389,568, for making Y-shaped capacitors.

There is still a need in the semiconductor industry to provide a simple COB DRAM process having a more planar stacked capacitor structure that eliminates the need for chemical/mechanical polishing, and also avoid the need to etch very thick polysilicon layers.

SUMMARY OF THE INVENTION

It is a principal object of the present invention to fabricate DRAM chips having an array of closely spaced capacitor-over-bit line (COB) dynamic random access memory (DRAM) cells that have a more planar surface topography across the DRAM chip for improved processing tolerances.

It is another object of the present invention to form these arrays of memory cells using a simplified process that eliminates the need for chemical/mechanical polishing to globally planarize the chip and thereby provide a more cost-effective manufacturing process.

Still another object of this invention is to avoid the necessity to pattern a thick polysilicon layer for forming the capacitor bottom electrode (node) thereby eliminating the need for a thick photoresist that would otherwise reduce the photolithographic resolution.

In summery, this invention provides a method for making an array of dynamic random access memory (DRAM) cells with stacked capacitors that are formed essentially planar with the surface over the periphery of the DRAM chip. This method eliminates the need for chemical/mechanical polishing of an insulating layer over the stacked capacitors and is therefore a more cost-effective process. The process also utilizes a much thinner polysilicon layer for the capacitor bottom electrodes. A thinner photoresist mask can be used to pattern the polysilicon layer with improved photo-resist resolution.

The method for making these DRAM devices (chips) begins by providing a semiconductor substrate. Typically the substrate is a P$^-$ doped single-crystal silicon having a <100> crystallographic orientation. Device areas are formed, which include an array of device areas for the memory cells, by forming a relatively thick Field OXide (FOX) that surrounds and electrically isolates each device area in and on the substrate. One method of forming the field oxide areas is by a shallow trench isolation (STI) method, as is commonly used in the industry. This STI is formed by etching trenches or recesses in the field oxide areas on the substrate. Then the trenches are filled with an insulating material and made planar with the substrate surface. Alternatively, another common method of forming the field oxide is by the LOCal Oxidation of Silicon (LOCOS) method in which the substrate is selectively oxidized in the field oxide areas. The FETs, which include the access transistors for the memory cells, are formed next by forming a thin gate oxide on the device areas, and then depositing a polycide layer composed of a heavily N$^+$ doped polysilicon layer with a refractory metal silicide layer, such as tungsten silicide, on the top surface of the polysilicon. A relatively thick cap oxide layer, such as silicon oxide ($SiO_2$) or silicon oxide and silicon nitride ($Si_3N_4$), is deposited. The cap oxide layer and the polycide layer are then patterned to form FET gate electrodes on the device areas, including the memory cell device areas for the access transistors, and concurrently to form word lines over the field oxide areas. Ion implantation is used to form the source/drain areas, one on each side of the gate electrode for each FET. Conventional lightly doped source/drain area and sidewall spacers are included to minimize short-channel effects on these submicron FET devices. A doped first polysilicon layer is deposited and patterned using photolithographic techniques and anisotropic plasma etching to form bit lines that contact one of the source/drain areas of each FET, while the first polysilicon layer is concurrently patterned to form polysilicon landing pads that provide the node contacts for the stacked capacitors to the second source/drain area of each FET. A relatively thick first insulating layer is deposited to provide an inter-polysilicon dielectric (IPD) layer over the bit lines and the polysilicon landing pads. The first insulating layer is composed of a borophosphosilicate glass (BPSG) having a low glass temperature, and is annealed to provide an essentially planar surface. Contact openings for the capacitors are now etched in the first insulating layer to the polysilicon landing pads.

Now more specific to the method of this invention, the capacitor bottom electrodes are formed next. A doped relatively thin second polysilicon layer is deposited over the first insulating layer, but sufficiently thick to fill the contact openings. A photoresist mask and anisotropic plasma etching are used to etch trenches or recesses around and between the desired capacitor areas. Each capacitor area is over one of the capacitor contact openings. The trenches are etched through the second polysilicon layer and partially into the first insulating layer. Also important to this invention the photoresist mask is retained over the remainder of the DRAM chips, which includes the peripheral areas on the chips, to prevent etching. This allows the capacitors to be formed without causing a large step at the perimeter of the array of memory cells. The photoresist mask is stripped and a conductively doped conformal third polysilicon layer is deposited over and in the trenches. The third polysilicon layer is then anisotropically plasma etched back to form polysilicon sidewall spacers for the capacitor bottom electrodes, thereby increasing the capacitor area. The etching also removes the third polysilicon layer in the trenches to electrically isolates the individual capacitor bottom electrodes from the adjacent capacitors. An interelectrode dielectric layer is then formed on the bottom electrodes and a relatively thin conformal fourth polysilicon layer is deposited to form the capacitor top electrodes (plate) while filling said trenches to form an essentially planar surface. The fourth polysilicon layer is patterned to form the capacitor top electrodes, and the etching is continued to remove the second polysilicon layer on the periphery of the DRAM chip area devices, resulting in an essentially planar surface across the DRAM chip area. For example, the step at the perimeter of the array of memory cells would only be equal the sum of the two relatively thin second and fourth polysilicon layers. A second insulating layer is now deposited and leveled to provide a much improved (planar) surface on which to expose distortion free photoresist images (mask) for etching the via holes. Also the planar surface allows the next metal level (metal 1) to be patterned without leaving residue, as would naturally occur over the rough topography of the prior art. Additional levels of metal levels with interposed insulating layer having via holes can then used to complete the DRAM devices.

BRIEF DESCRIPTION OF THE DRAWINGS

The above objects and advantages of this invention are best understood with reference to the attached drawings in the figures and the embodiment that follows.

DESCRIPTION OF THE PREFERRED EMBODIMENT

The present invention describes in detail a method for making a more planar Capacitor-Over-Bit line (COB) structure on DRAM devices. The array of stacked capacitor are made in a way that substantially reduces the step height at the perimeter of the array of memory cell in the DRAM chip area. This more planar surface results in a much improved surface for exposing and developing distortion free photoresist mask images. The smoother surface across the DRAM chip area also allows metal interconnections to be anisotropically plasma etched during subsequent processing without leaving metal residue that can otherwise cause intralevel shorts. Although the process is described for making memory cells for DRAM devices having N-channel FETs as the access transistors, it should also be well understood by one skilled in the art that by including additional processing steps, in addition to those described in this embodiment, other types of devices can be included on this improved DRAM chip. For example, by forming N-well regions in a P-doped substrate, P-channel FETs can also be provided from which Complementary Metal-Oxide-Semiconductor (CMOS) circuits can be formed, that are required for the peripheral circuits on the DRAM chip.

Figure 2:
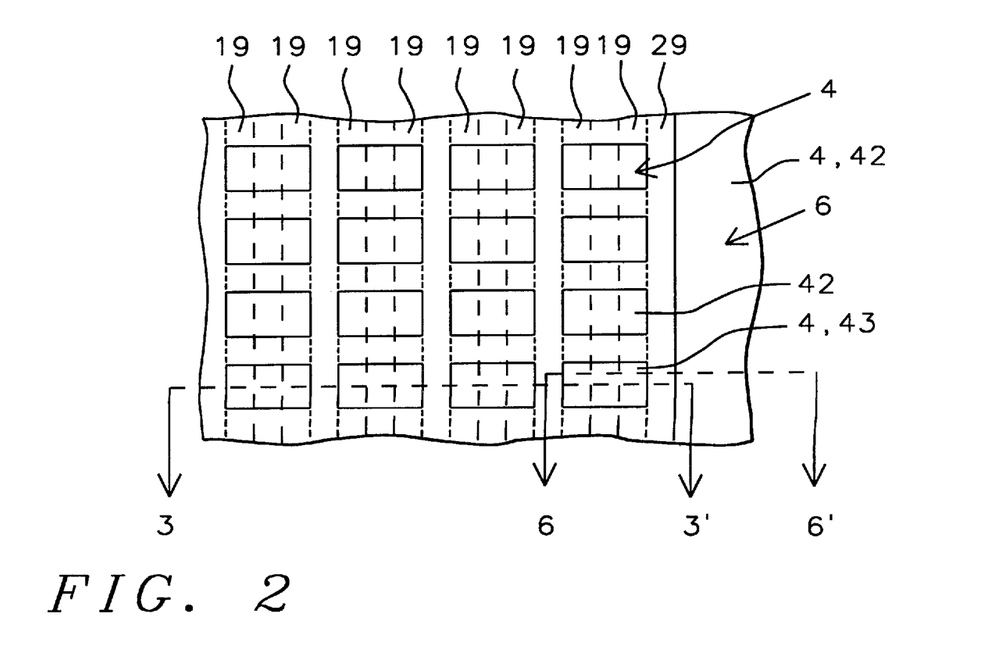
FIG. 2 shows a schematic top view of a portion of a memory cell area of a partially completed DRAM device in a chip area on a substrate by the method of this invention.

To put this invention in better perspective, a schematic top view for a partially completed DRAM is shown in FIG. 2. The top view is shown for a portion of the memory cell area on a DRAM device (chip) formed on a semiconductor substrate 10. The top view is shown for a partially completed DRAM structure after the processing steps relating to FIG. 3 and is described later in detail. Only some of the underlying structure is depicted to simply the drawing and discussion. The memory cell area consist of an array of word lines 19 which also serve as the gate electrodes for the access transistors (FETs) over device areas (not shown). Also shown is the array of capacitor bottom (node) electrodes 4 for the stacked capacitors having portions of a photoresist mask 42 still in place. Also shown in FIG. 2 is a portion of the peripheral area 6 adjacent to the array of memory cells on the DRAM chip area.

Figure 3:
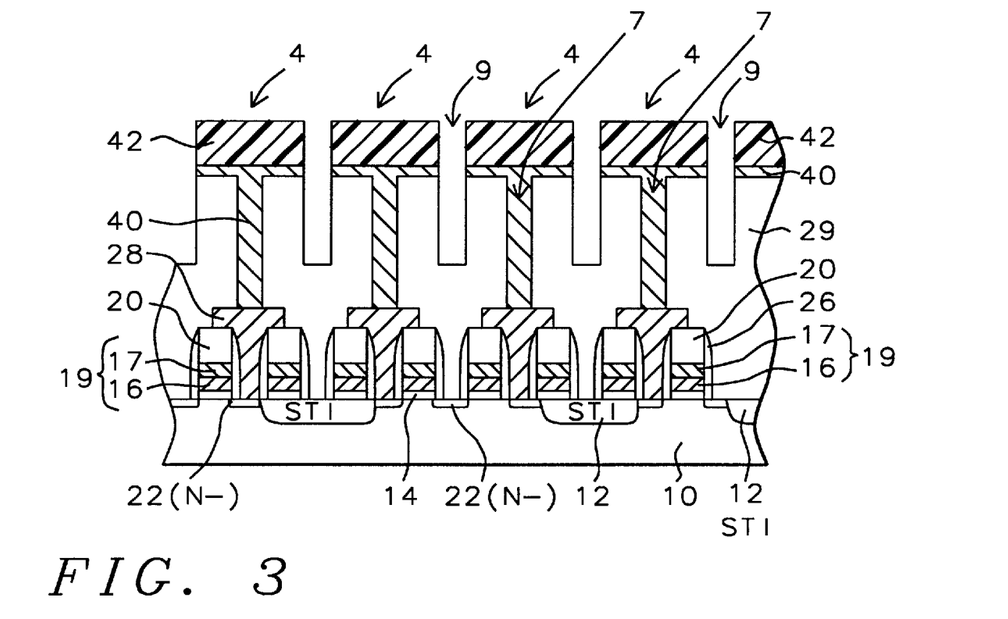
FIGS. 3 through 5 are schematic cross-sectional view through a portion of the memory cell area shown in FIG. 2. for the sequence of process steps up to and including the formation of the capacitor bottom electrodes by this invention.

Referring now to FIG. 3, the method for making these planar DRAM devices is described with reference to the cross section through region 3–3' of FIG. 2. The method begins by providing a semiconductor substrate 10. Typically the substrate is a P$^-$ doped single-crystal silicon substrate 10 having a <100> crystallographic orientation. A relatively thick field oxide (FOX) 12 is formed in and on the substrate 10 surrounding and electrically isolating a device areas, which include the device areas for the memory cells. One method of forming the field oxide areas is by a shallow trench isolation (STI) method, as is commonly used in the industry. Briefly, the STI is formed by etching trenches or recesses in the field oxide areas on the substrate using an hard mask such as silicon nitride. Then the trenches are thermally oxidized and filled with an insulating material, such chemical vapor deposited silicon oxide CVD-SiO$_2$), and made planar with the substrate surface. For example, a chemical/mechanical polishing (CMP) or etch back technique can be used to planarize the FOX. Alternatively, another common method of forming the field oxide is by the LOCal Oxidation of Silicon (LOCOS) method in which a patterned oxidation barrier mask, such as silicon nitride (Si$_3$N$_4$) is used to selectively oxidized the substrate 10 in the field oxide areas. The preferred thickness of the FOX is between about 4000 and 5000 Angstroms.

Still referring to FIG. 3, the field effect transistors (FETs) which include the access transistors for the memory cells and the FET's for the peripheral circuits are formed next by forming a thin gate oxide 14 on the device areas. For example the gate oxide can be formed by thermal oxidation and is grown to a thickness of between about 50 and 200 Angstroms. A polycide layer 19 composed of a heavily N$^+$ doped polysilicon layer 16 and a top refractory metal silicide layer 17 is deposited. The polysilicon layer 16 is deposited by low pressure chemical vapor deposition (LPCVD) using silane (SiH$_4$) as the reactant gas. Typically layer 16 is doped by ion implantation with arsenic ions (As$^{75}$) or phosphorous ions (p$^{31}$) to a concentration of between about 1.0 E 20 and 1.0 E 22 atoms/cm$^3$. The silicide layer 17 is preferably tungsten silicide (WSi$_2$) and can be deposited by CVD using silane and tungsten hexafluoride (WF$_6$). Layer 17 is deposited to a thickness of between about 400 and 1500 Angstroms. Alternatively, layer 17 can be a tungsten (W), titanium (Ti), or W/Ti stack. Also, layer 17 can be a TiSi$_2$. A cap oxide layer 20 is deposited, for example by CVD. Typically the layer 20 is a silicon oxide (SiO$_2$) layer or silicon oxide layer and silicon nitride (Si$_3$N$_4$) layer, and is deposited to a thickness of between about 500 and 3000 Angstroms. The cap oxide layer 20 and the polycide layer 19 are then patterned using conventional photolithographic techniques and anisotropic plasma etching to form the gate electrodes for the FETs on the device areas and concurrently to form the word lines 19 over the field oxide regions 12. Lightly doped source/drain areas 22(N$^-$) for the FETs are formed next by ion implanting an N-type dopant species, such as arsenic or phosphorous to minimize the FET short channel effects. For example, a typical implant might consist of phosphorus ions (P$^{31}$) at a dose of between about 1.0 E 12 and 1.0 E 14 ions/cm$^3$ and an implant energy of between about 30 and 80 KeV. After forming the lightly doped source/drain areas 22 insulating sidewall spacers 26 are formed on the gate electrode 19 sidewalls. The sidewall spacers 26 are formed by depositing an insulating layer, and then anisotropically etching back the insulating layer to the silicon substrate 10. For example, the insulating layer can be composed of silicon oxide formed by LPCVD. Heavily doped source/drain contact areas 24 are formed next to the lightly doped areas 22 to provide good ohmic contacts in the peripheral area of the chip, while masking the memory cell area from implanting to minimize leakage currents in the memory cell area. The contact areas 24 are typically formed by ion implantation using an N-type dopant such as arsenic or phosphorus and are typically doped to a concentration of between about 5.0 E 19 and 8.0 E 20 atoms/cm$^3$.

The remainder of the embodiment now describes in detail the method for making the array of memory cells having a capacitor-over-bit line (COB) structure while essentially eliminating the large step near the perimeter of the cell array.

As shown in FIG. 3, a doped first polysilicon layer 28 is deposited. Layer 28 is deposited using LPCVD and a reactant such as silane ($SiH_4$) and is deposited preferably to a thickness of between about 400 and 2000 Angstroms. The first polysilicon Layer 28 is then doped with an N-type dopant such as arsenic or phosphorus using for example ion implantation. Alternatively, layer 28 can be doped in-situ during the LPCVD deposition using a dopant gas such as arsine ($AsH_3$) or phosphine ($PH_3$). The first polysilicon layer 28 is preferably doped to a concentration of between about 1.0 E 18 and 5.0 E 20 atoms/$cm^3$ Additionally a silicide layer, such as tungsten silicide (not shown) can be deposited on layer 28 to increase the electrical conductivity and improve device performance.

The first polysilicon layer 28 is then patterned using photolithographic techniques and anisotropic plasma etching to form bit lines that contact one of the source/drain areas of each FET (the bit lines not visible in the cross section through 3–3'), while layer 28 is at the same time patterned to form polysilicon landing pads 28 over the second source/drain area 22($N^-$) of each FET, as shown in FIG. 3. The landing pads provide the node contacts for the stacked capacitors, and by virtue of being etched at the same time as the bit lines are self-aligned to the bit lines.

A relatively thick first insulating layer 29, that serves as an inter-polysilicon dielectric layer (IPD), is deposited over the bit lines (not shown) and the polysilicon landing pads 28. The first insulating layer 29 is preferably composed of a low-glass-temperature glass such as a borophosphosilicate glass (BPSG) and is deposited using CVD and a reactant gas such tetraethoxysilane (TEOS) with appropriate boron and phosphorus dopant gases. Layer 29 is deposited to a preferred thickness of between about 9000 and 12000 Angstroms. To level or make planar layer 29 the substrate is annealed at a preferred temperature of between about 800 and 875° C. (degree centigrade) for a time of between about 15 and 45 minutes.

Still referring to FIG. 3, conventional photolithographic techniques and an anisotropic plasma etching is used to etch node contact openings 7 in layer 29 to the polysilicon landing pads 28. For example, the contact openings 7 can be etched using reactive ion etching (RIE) or high-density plasma (HDP) etching using an etchant gas such as trifluoromethane ($CHF_3$).

The node contacts and portions of the capacitor bottom electrodes are formed by depositing a relatively thin second polysilicon layer 40 sufficient to fill the contact openings 7 and provide a thin polysilicon layer on the top surface of the first insulating layer 29. Polysilicon layer 40 is deposited to a preferred thickness of between about 2000 and 3000 Angstroms. Layer 40 is deposited by LPCVD using a reactant gas such as silane ($SiH_4$) and is in-situ doped with an N-type dopant during deposition, for example, by adding a dopant gas such as phosphine ($PH_3$). Layer 40 is doped to a preferred concentration of between about 5.0 E 19 and 5.0 E 21 atoms/$cm^3$.

A photoresist layer 42 is then formed by spin coating and patterned to leave portion over the desired capacitor areas 4 and anisotropic plasma etching are used to etch trenches 9 or recesses around and between the desired capacitor areas 4, as shown in FIG. 3 and in the top view of FIG. 2. One of the key feature of this invention to avoid the large step at the perimeter of the array of cells is that the photoresist mask 42 in retained over the peripheral areas 6 of the DRAM chip, as is also depicted in FIGS. 2 and 3.

Continuing with the process, the photoresist mask 42 is used as an etch mask and an anisotropic plasma etch is used to etch through the first polysilicon layer 40 and to etch trenches 9 in the first insulating layer 29 surrounding the capacitor areas 4. The etching is carried out using RIE or HDP etching. Preferably the polysilicon layer 40 is etched using an etchant gas such as hydrogen bromide (HBr) or sulfur hexafluoride ($SF_6$) and the BPSG layer 29 is etched using an etchant gas such as $CHF_3$. The trenches 9 are etched to a preferred depth of between about 6000 and 10000 Angstroms, and more specifically etched to a depth depending on the final capacitance required for the DRAM.

Figure 4:
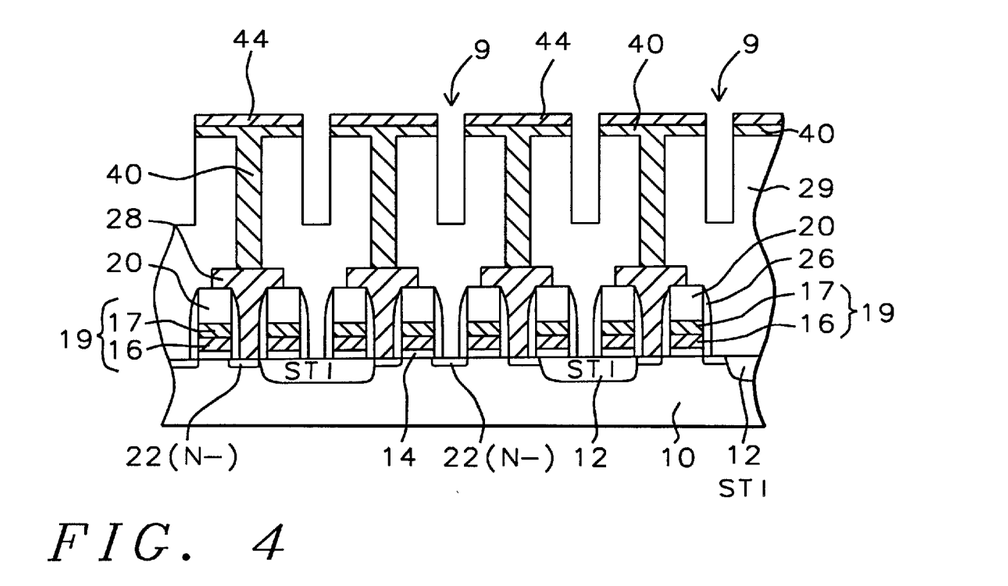
Figure 5:
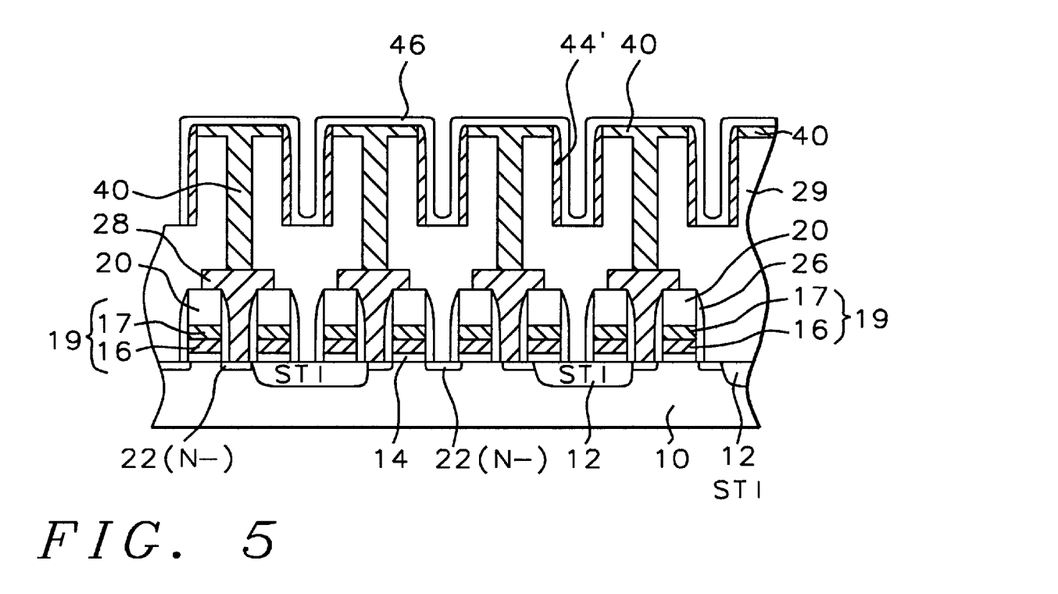

Referring now to FIG. 4, the photoresist mask 42, is stripped and a conformal third polysilicon layer 44 is deposited. Layer 44 is deposited similar to the method for depositing the second polysilicon layer 40 using LPCVD and is in situ doped with phosphorus to a preferred concentration of between about 5.0 E 19 and 5.0 E 21 atoms/$cm^3$. The third polysilicon layer 44 is deposited to a thickness that is less than ½ the width of the trenches 9, but preferably to a thickness of between about 500 and 1000 Angstroms. This non-filling of the trenches 9 is important because polysilicon layer 44 is now anisotropically etched back to form sidewall spacers 44', as shown in FIG. 5. The etching is carried out at a low pressure using RIE or in a HDP etcher using an etchant gas such as HBr or $SF_6$. This etch-back also removes the polysilicon layer 44 at the bottom of the trenches 9 to form the array of capacitor bottom electrodes which are electrically isolated from each other. The sidewall spacers furthermore significantly increase the capacitor area.

Referring to FIG. 5, a thin capacitor inter-electrode dielectric layer 46 having a high dielectric constant is formed on the surface of the bottom electrodes. The layer 48 is typically composed of a layer of silicon oxide and silicon nitride (ON) or a triple layer of silicon oxide, silicon nitride and silicon oxide (ONO). For example, the first silicon oxide layer can be formed by thermal oxidation of the polysilicon surface in a dry oxygen. The silicon nitride layer can be formed by using a LPCVD in a gas mixture of dichlorosilane ($SiCl_2H_2$) and ammonia ($NH_3$). The top oxide layer can be formed by partially reducing the silicon nitride layer at an elevated temperature in oxygen to complete the ONO. The total thickness of the ON or ONO layer 46 is between about 35 and 65 Angstroms. Alternatively, other high-dielectric-constant materials can be used and or the surface can be roughened by well known means to further increase the capacitance.

Figure 6:
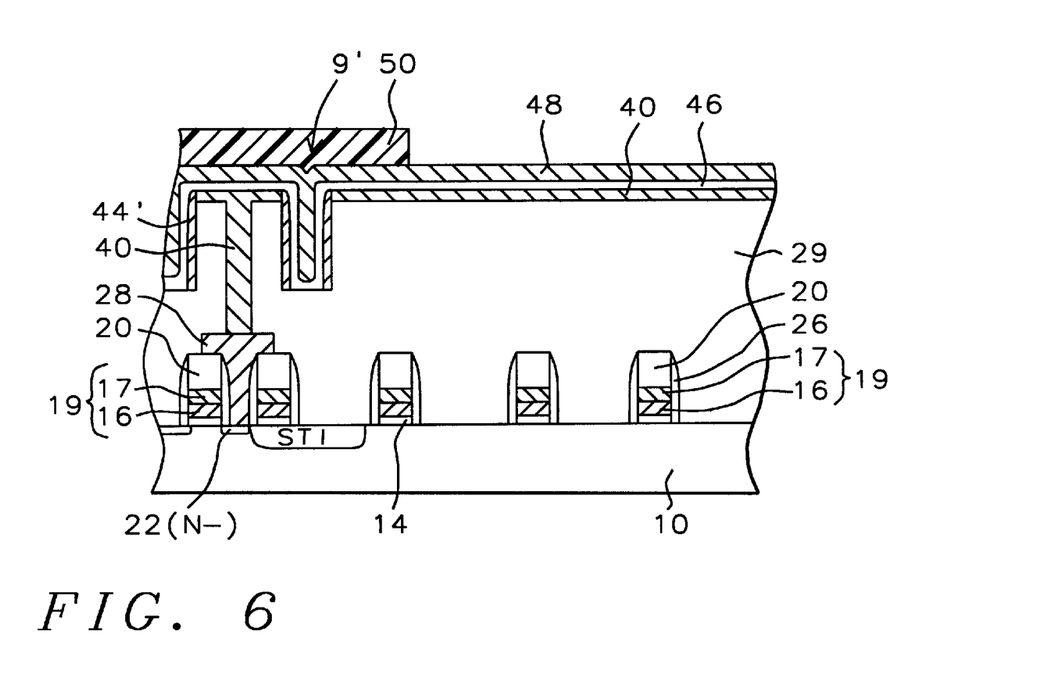
FIGS. 6 through 8 are schematic cross-sectional views through a portion of the DRAM chip at the perimeter of the array of memory cells depicting the remaining sequence of process steps of this invention for making a capacitor-over-bit line (COB) structure having a more planar surface across the DRAM chip area.

Referring next to FIG. 6, a cross section is shown for the region through 6–6' in FIG. 2. This cross section include an increasing portion of the periphery of the DRAM chip and depict more clearly the advantage of the present invention to reduce the step height at the perimeter of the array of memory cells.

Continuing with the process, a relatively thin conformal fourth polysilicon layer 48 is deposited to form the capacitor top electrodes (capacitor plate). The polysilicon layer is deposited by LPCVD and is in situ doped, preferably with phosphorus to form an N-type conductive layer. The layer 48 is doped to a preferred concentration of between about 1.0 E 20 and 1.0 E 21 atoms/$cm^3$. The fourth polysilicon layer 48 is also deposited to a thickness sufficient to fill the remaining space in the trenches 9 between the sidewall spacers 44', and more specifically layer 48 is deposited to a preferred thickness of between about 300 and 2000 Angstroms. This results in an essentially planar surface over the array of memory cells.

A photoresist mask 50 is then formed by conventional photolithographic techniques for patterning the fourth polysilicon layer 48 to form the top electrodes (plates) for the array of stacked capacitors. As shown in FIG. 6, the edge of the photoresist mask 50 extends over the outmost trench 9'.

Figure 7:
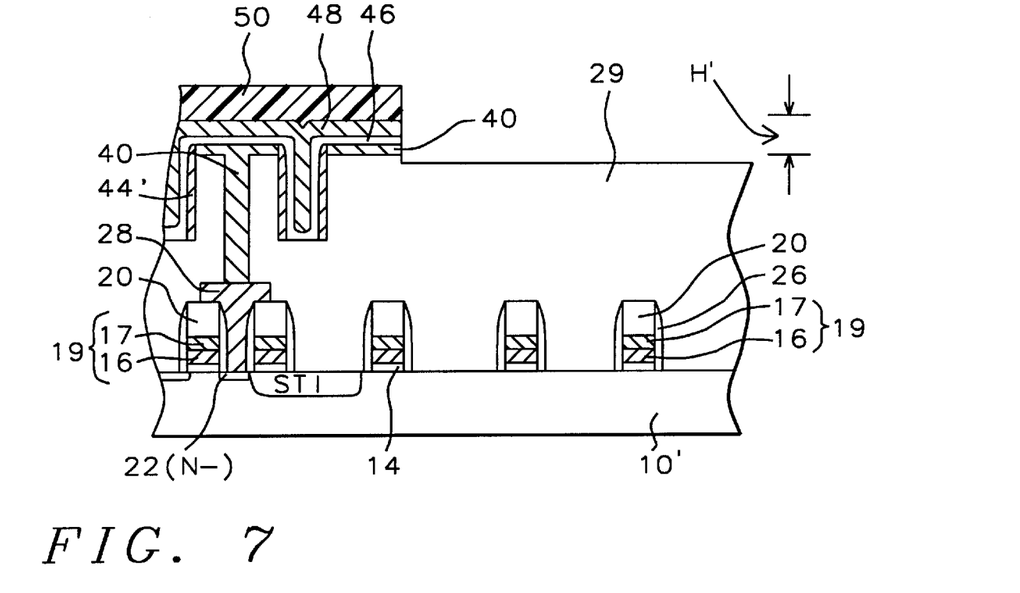

Using the photoresist mask 50 as an etch mask the fourth polysilicon 48 is selectively removed over the peripheral areas of the DRAM chip area, and the etching is continued to etch the thin interelectrode dielectric layer 46 and remove the second polysilicon layer 40 to the first insulating layer 29. For example, the polysilicon can be etched using a RIE and an etchant gas such as HBr or $SF_6$ with an etch-rate selectivity of polysilicon to silicon oxide greater than 20:1. This results in a step height H' about equal to sum of the polysilicon layer 40 and 48 and is considerably less than the step height H resulting from the prior art DRAM structure of FIG. 1. For example to achieve about the same capacitor area the height H for the prior art structure would be greater than 1.0 micrometers (um), while the step height H' by this invention is only about 0.2 to 0.3 um.

Figure 8:
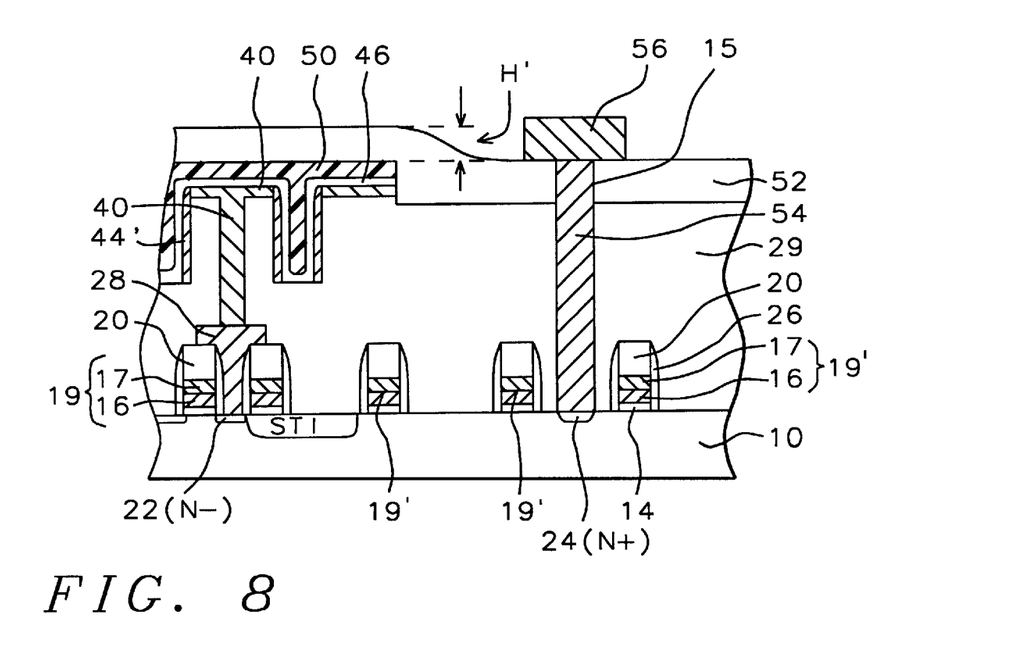

Finally as shown in FIG. 8, the DRAM device is now completed up to and including the first level of metal interconnections. The photoresist mask 50 is striped and a second insulating layer 52, commonly referred to as the interlevel dielectric (ILD) layer, is deposited. The layer 52 is preferably a BPSG oxide and is deposited to a thickness of between about 3000 and 8000 Angstroms. The BPSG is then annealed similar to the first insulating layer 29 to provide a leveling effect. Next contact holes or via holes 15 are etched in the insulating layers 29 and 52 for making electrical contacts to the substrate or underlying devices. The contact openings are then filled with metal plugs, for example composed of tungsten (W) and a first metal layer 56 is then deposited and patterned, such as an alloy of aluminium and copper to complete the DRAM device to the first level of metal interconnections. The reduced step height H' resulting from the process described in FIGS. 3–7 is also replicated in the insulating layer 52 and provides an excellent (more planar) surface on which to expose the subsequent photoresist layers requiring a more shall depth of focus. Also the next level of metal interconnections formed by photoresist masking and directional etch is less likely to have intralevel shorts from residual metal because of the less rougher topography.

While the invention has been particularly shown and described with reference to the preferred embodiment thereof, it will be understood by those skilled in the art that various changes in form and details may be made without departing from the spirit and scope of the invention.

What is claimed is:

1. A method for making an array of memory cells with capacitor-over-bit-line structures for dynamic random access memory (DRAM) devices on a substrate comprising the steps of:

providing a semiconductor substrate having an array of field effect transistors (FETs) in each of said DRAM devices, and having gate electrodes for said FETs formed from a patterned polycide layer with a cap oxide, and each of said FETs having two adjacent source/drain areas;

depositing a first polysilicon layer;

patterning said first polysilicon layer to form bit lines that contact first of said source/drain areas of each of said FETs, and concurrently forming polysilicon landing pads for capacitors over and contacting second of said source/drain areas of each of said FETs;

depositing and planarizing a first insulating layer;

etching contact openings in said first insulating layer to said polysilicon landing pads;

depositing a second polysilicon layer over said first insulating layer and filling said contact openings to form capacitor node contacts;

anisotropic plasma etching using a patterned photoresist mask to etch through said second polysilicon layer and forming trenches in said first insulating layer surrounding said capacitor node contacts and defining the perimeter for desired capacitor regions for each of said memory cells, while protecting from etching said second polysilicon layer and said first insulating layer elsewhere on said DRAM devices;

stripping said photomask mask;

depositing a conformal third polysilicon layer over said trenches;

anisotropic plasma etching back said third polysilicon layer to form sidewall spacers in said trenches for bottom electrodes of said capacitors;

forming an interelectrode dielectric layer on said bottom electrodes;

depositing a conformal fourth polysilicon layer for capacitor top electrodes while filling said trenches to form an essentially planar surface;

etching to pattern said fourth polysilicon layer to form said capacitor top electrodes, and continuing said etching to remove said second polysilicon layer on the perimeter of said DRAM devices to complete said array of memory cells.

2. The method of claim 1, wherein said first polysilicon layer is conductively doped and has a thickness of between about 400 and 2000 Angstroms.

3. The method of claim 2, wherein said first polysilicon layer has a tungsten silicide layer on its surface.

4. The method of claim 1, wherein said first insulating layer is deposited by chemical vapor deposition (CVD) using tetraethosiloxane (TEOS) and in-situ doped with boron and phosphorus to form a borophosphosilicate glass (BPSG).

5. The method of claim 4, wherein said BPSG is planarized by thermal annealing.

6. The method of claim 1, wherein first insulating layer is deposited to a thickness of between about 9000 and 12000 Angstroms.

7. The method of claim 1, wherein said second polysilicon layer is conductively doped and is deposited to a thickness of between about 1000 and 3000 Angstroms.

8. The method of claim 1, wherein said third polysilicon layer is conductively doped and is deposited to a thickness of between about 500 and 1000 Angstroms.

9. The method of claim 1, wherein said interelectrode dielectric layer is composed of silicon oxide/silicon nitride/silicon oxide (ONO) and has an effective thickness of between about 35 and 65 Angstroms.

10. The method of claim 1, wherein said fourth polysilicon layer is conductively doped and deposited to a thickness of between about 500 and 1000 Angstroms.

11. A method for making dynamic random access memory (DRAM) devices having an array of memory cells with capacitor-over-bit-line structures on a substrate comprising the steps of:

providing a semiconductor substrate having an array of field effect transistors (FETs) in each of said DRAM devices, and having gate electrodes for said FETs formed from a patterned polycide layer with a cap oxide, and each of said FETs having two adjacent source/drain areas;

depositing a first polysilicon layer;

patterning said first polysilicon layer to form bit lines that contact first of said source/drain areas of each of said FETs, and concurrently forming polysilicon landing pads for capacitors over and contacting second of said source/drain areas of each of said FETs;

depositing and planarizing a first insulating layer;

etching contact openings in said first insulating layer to said polysilicon landing pads;

depositing a second polysilicon layer over said first insulating layer and filling said contact openings to form capacitor node contacts;

anisotropic plasma etching using a patterned photoresist mask to etch through said second polysilicon layer and forming trenches in said first insulating layer surrounding said capacitor node contacts and defining the perimeter for desired capacitor regions for each of said memory cells, while protecting from etching said second polysilicon layer and said first insulating layer elsewhere on said DRAM devices;

stripping said photomask mask;

depositing a conformal third polysilicon layer over said trenches;

anisotropic plasma etching back said third polysilicon layer to form sidewall spacers in said trenches for bottom electrodes of said capacitors;

forming an interelectrode dielectric layer on said bottom electrodes;

depositing a conformal fourth polysilicon layer for capacitor top electrodes while filling said trenches to form an essentially planar surface;

etching to pattern said fourth polysilicon layer to form said capacitor top electrodes, and continuing said etching to remove said second polysilicon layer on the perimeter of said DRAM devices, resulting in an essentially planar surface;

depositing and levelling a second insulating layer;

forming contact openings in said insulating layers and forming additional levels of wiring to complete said DRAM devices.

12. The method of claim 11, wherein said first polysilicon layer is conductively doped and has a thickness of between about 400 and 2000 Angstroms.

13. The method of claim 12, wherein said first polysilicon layer has a tungsten silicide layer on its surface.

14. The method of claim 11, wherein said first insulating layer is deposited by chemical vapor deposition (CVD) using tetraethosiloxane (TEOS) and in-situ doped with boron and phosphorus to form a borophosphosilicate glass (BPSG).

15. The method of claim 14, wherein said BPSG is planarized by thermal annealing.

16. The method of claim 11, wherein first insulating layer is deposited to a thickness of between about 9000 and 12000 Angstroms.

17. The method of claim 11, wherein said second polysilicon layer is conductively doped and is deposited to a thickness of between about 1000 and 3000 Angstroms.

18. The method of claim 11, wherein said third polysilicon layer is conductively doped and is deposited to a thickness of between about 500 and 1000 Angstroms.

19. The method of claim 11, wherein said interelectrode dielectric layer is composed of silicon oxide/silicon nitride/silicon oxide (ONO) and has an effective thickness of between about 35 and 65 Angstroms.

20. The method of claim 11, wherein said fourth polysilicon layer is conductively doped and deposited to a thickness of between about 500 and 1000 Angstroms.

21. The method of claim 11, wherein said second insulating layer is an interlevel dielectric layer composed of a borophosphosilicate glass which is levelled by thermal annealing.

* * * * *